(12) United States Patent
Wang et al.

(10) Patent No.: US 11,184,985 B2
(45) Date of Patent: Nov. 23, 2021

(54) METHOD OF MANUFACTURING TOUCH STRUCTURE AND TOUCH STRUCTURE

(71) Applicants: BOE Technology Group Co., Ltd., Beijing (CN); Hefei Xinsheng Optoelectronics Technology Co., Ltd., Anhui (CN)

(72) Inventors: Jing Wang, Beijing (CN); Zouming Xu, Beijing (CN); Xiaodong Xie, Beijing (CN); Lei Zhang, Beijing (CN); Xianlin Ding, Beijing (CN); Qitao Zheng, Beijing (CN); Tsung Chieh Kuo, Beijing (CN); Dong Li, Beijing (CN); Qicheng Chen, Beijing (CN); Ting Zeng, Bejing (CN); Ming Zhang, Beijing (CN); Seong Cho Lee, Beijing (CN); Lingyan Wu, Beijing (CN); Guiyu Zhang, Beijing (CN)

(73) Assignees: BOE Technology Group Co., Ltd., Beijing (CN); Hefei Xinsheng Optoelectronics Technology Co., Ltd., Anhui (CN)

(*) Notice: Subject to any disclaimer, the term of this patent is extended or adjusted under 35 U.S.C. 154(b) by 511 days.

(21) Appl. No.: 16/098,030

(22) PCT Filed: Apr. 8, 2018

(86) PCT No.: PCT/CN2018/082197
§ 371 (c)(1),
(2) Date: Oct. 31, 2018

(87) PCT Pub. No.: WO2019/037433
PCT Pub. Date: Feb. 28, 2019

(65) Prior Publication Data
US 2021/0223915 A1     Jul. 22, 2021

(30) Foreign Application Priority Data

Aug. 22, 2017 (CN) .......................... 201710725537.8

(51) Int. Cl.
*H01H 11/00* (2006.01)
*H03K 17/96* (2006.01)
(Continued)

(52) U.S. Cl.
CPC ......... *H05K 3/4685* (2013.01); *G06F 3/0445* (2019.05); *G06F 3/0446* (2019.05);
(Continued)

(58) Field of Classification Search
CPC .. H05K 3/4685; H05K 3/4688; G06F 3/0445; G06F 2203/04103; G06F 2203/04111
(Continued)

(56) References Cited

U.S. PATENT DOCUMENTS

| 2013/0228442 A1* | 9/2013 | Mohaptatra | G06F 3/0446 200/600 |
| 2015/0225857 A1* | 8/2015 | Uchida | H05K 3/1283 428/212 |

(Continued)

FOREIGN PATENT DOCUMENTS

| CN | 101923412 A | 12/2010 |
| CN | 105093636 A | 11/2015 |

OTHER PUBLICATIONS

Jun. 20, 2018—(WO) International Search Report and Written Opinion Appn PCT/CN2018/082197 with English Translation.
(Continued)

*Primary Examiner* — Deeprose Subedi
(74) *Attorney, Agent, or Firm* — Banner & Witcoff, Ltd.

(57) ABSTRACT

A touch structure and a method of manufacturing the touch structure are provided. The method includes: forming a first
(Continued)

conductive layer on a base substrate; forming a second conductive layer on the first conductive layer; and patterning the first conductive layer and the second conductive layer to respectively form a first conductive layer pattern and a second conductive layer pattern; the first conductive layer pattern is formed after the second conductive layer pattern is formed, and the first conductive layer pattern and the second conductive layer pattern are different from each other.

17 Claims, 9 Drawing Sheets

(51) Int. Cl.
*H05K 3/46* (2006.01)
*G06F 3/044* (2006.01)

(52) U.S. Cl.
CPC .............. *G06F 2203/04103* (2013.01); *G06F 2203/04111* (2013.01); *H05K 3/4688* (2013.01)

(58) Field of Classification Search
USPC ......................................................... 216/13
See application file for complete search history.

(56) References Cited

U.S. PATENT DOCUMENTS

2015/0316806 A1 11/2015 Chang
2015/0370377 A1 12/2015 Ohara

OTHER PUBLICATIONS

Jun. 16, 2021—(EP) Extended European Search Report Appn 18788994.4.

\* cited by examiner

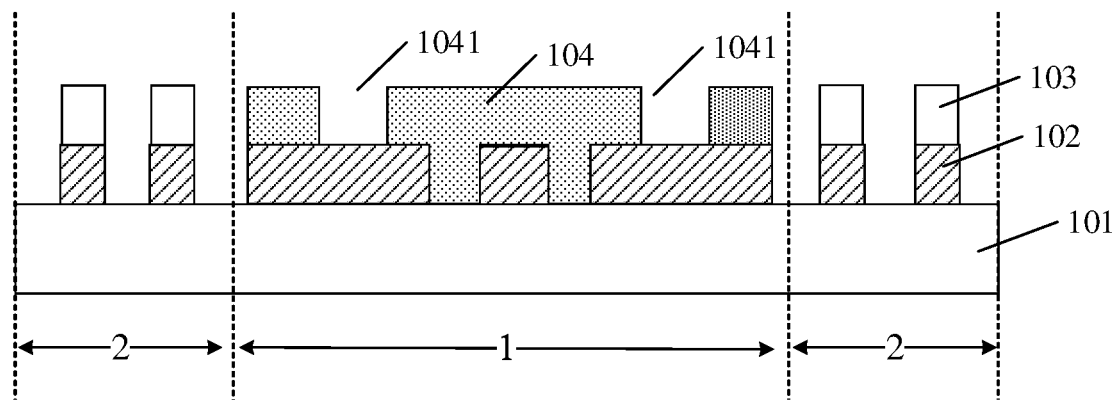
Fig. 5A1
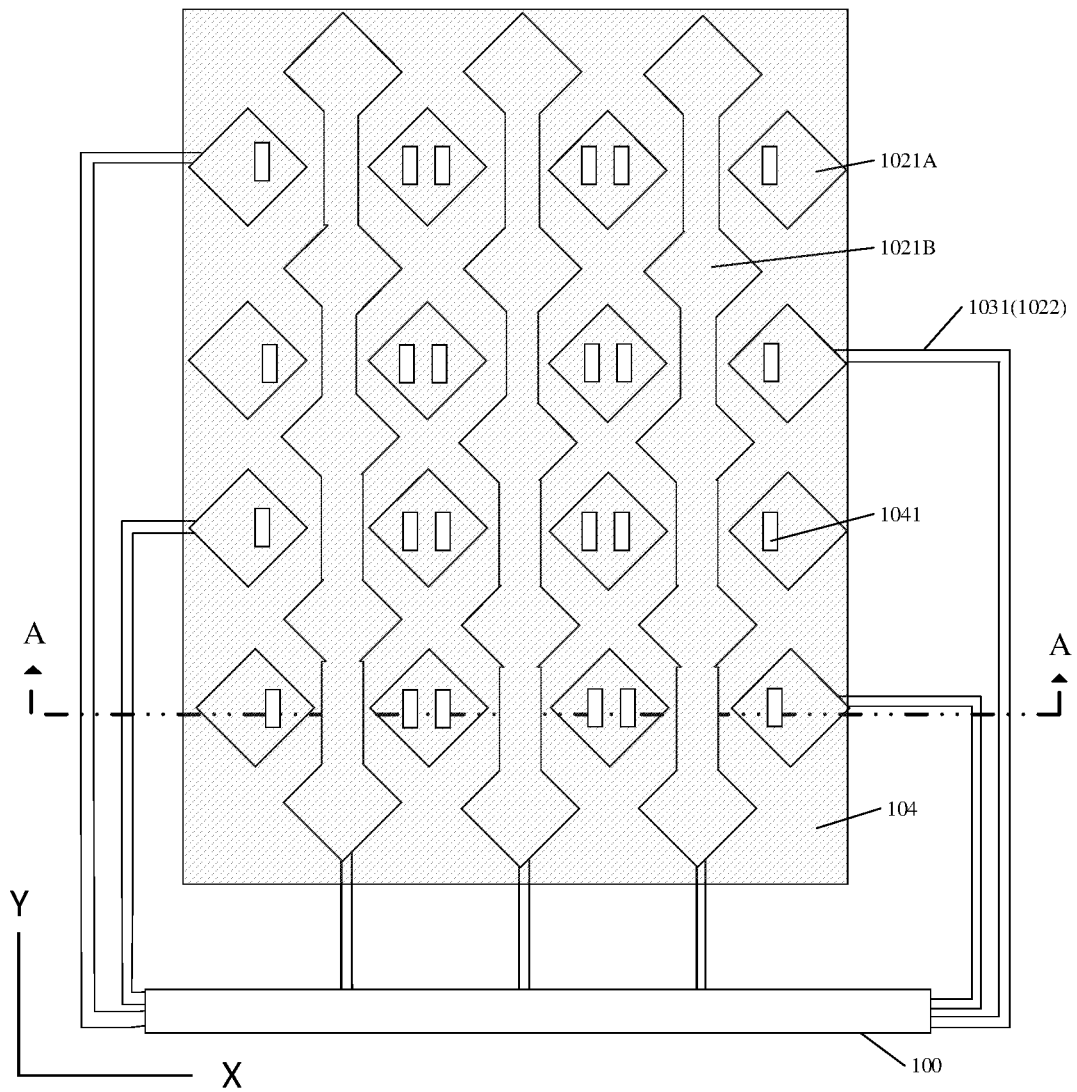
Fig. 5A2

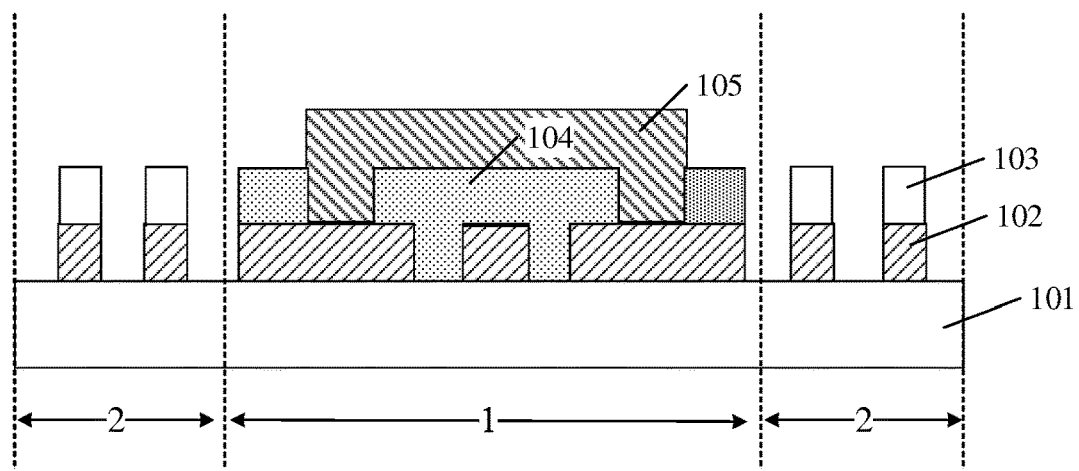
Fig. 5B1
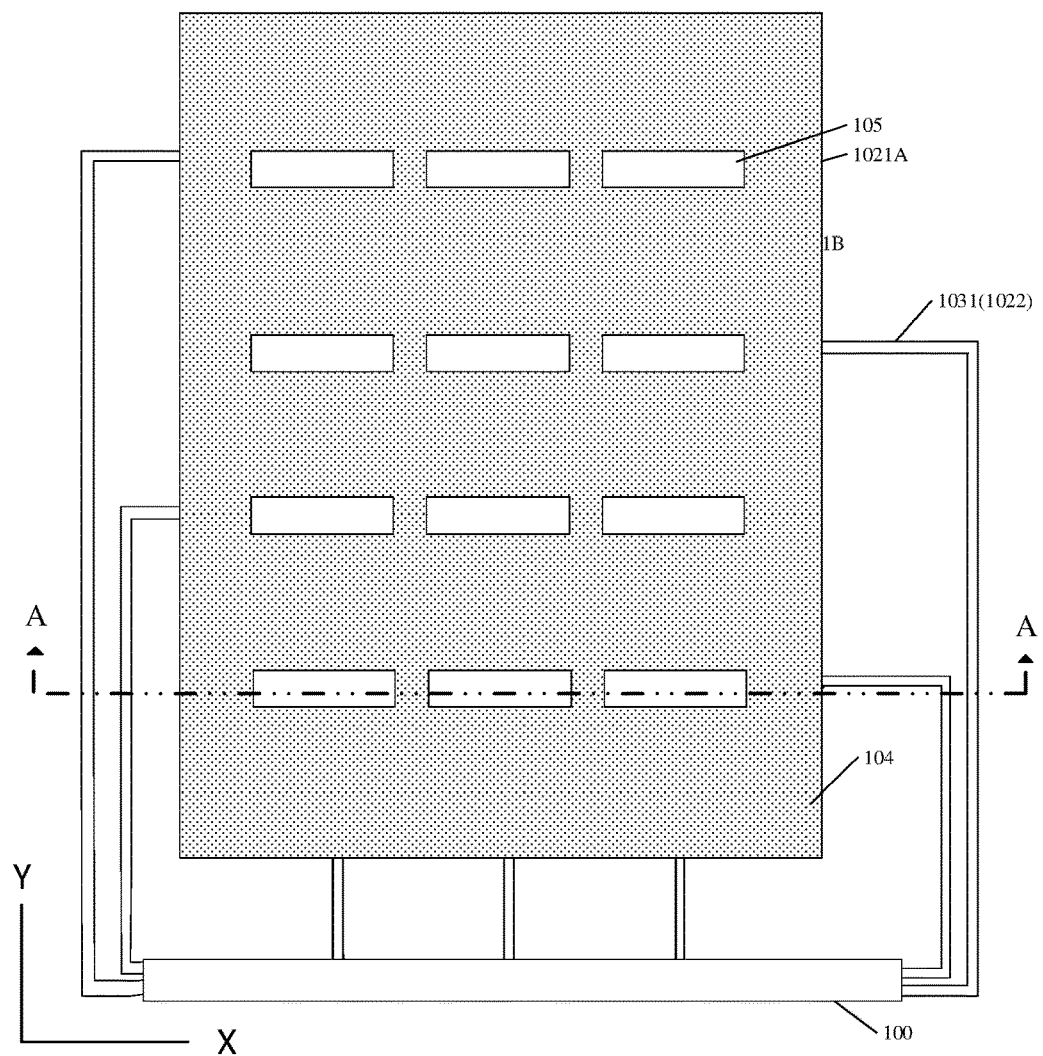
Fig. 5B2

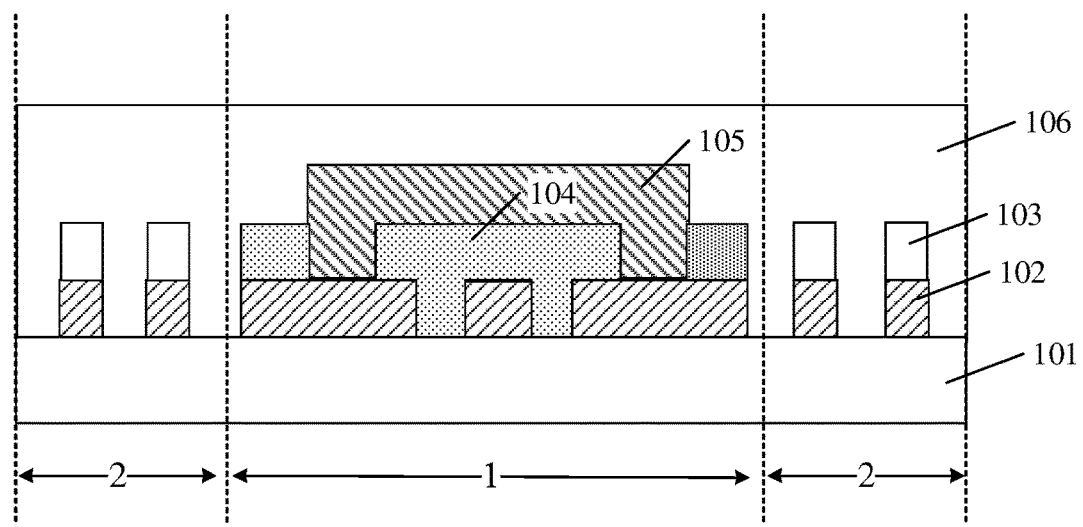
Fig. 5C1
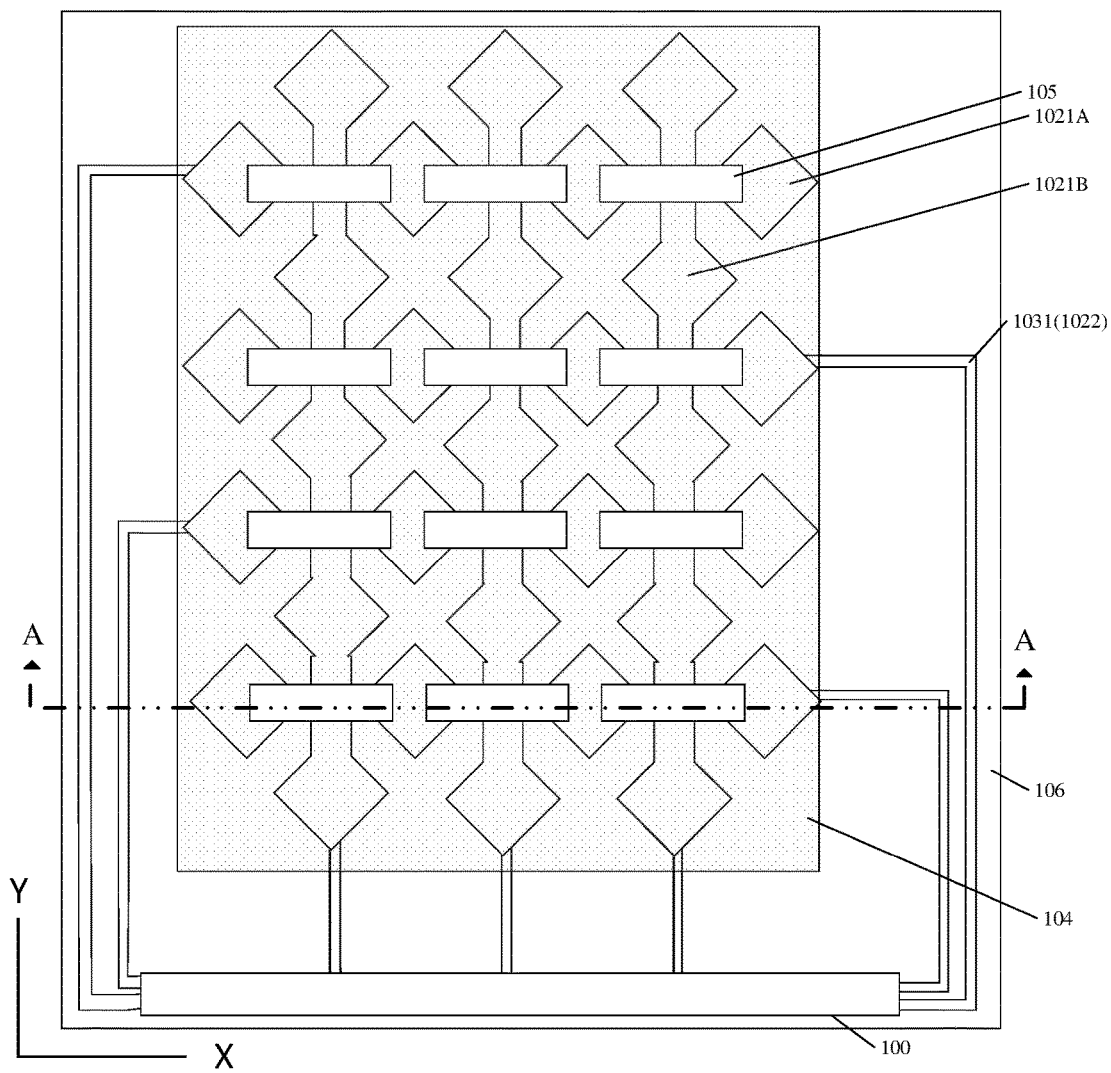
Fig. 5C2

METHOD OF MANUFACTURING TOUCH STRUCTURE AND TOUCH STRUCTURE

CROSS REFERENCE TO RELATED APPLICATION

The application is a U.S. National Phase Entry of International Application No. PCT/CN2018/082197 filed on Apr. 8, 2018, designating the United States of America and claiming priority to Chinese Patent Application No. 201710725537.8, filed on Aug. 22, 2017. The present application claims priority to and the benefit of the above-identified applications and the above-identified applications are incorporated by reference herein in their entirety.

TECHNICAL FIELD

Embodiments of the present disclosure relate to a method of manufacturing a touch structure and a touch structure.

BACKGROUND

As a kind of information input device, touch structures can achieve human-computer interactions simply and conveniently, and provide a new multimedia human-computer interaction method for people. According to different working principles and transmission media, the touch structures can be divided into a resistive type, a capacitive type, a surface acoustic wave type and an infrared type, in which the capacitive type touch structure is widely used because of its high accuracy and strong anti-interference ability. Moreover, the capacitive type touch structure has advantages such as sensitive touch response, achieving multi-touch easily, and so on, and therefore greatly satisfies people's pursuit of operation convenience.

SUMMARY

At least one embodiment of the present disclosure provides a method of manufacturing a touch structure, the method comprises: forming a first conductive layer on a base substrate; forming a second conductive layer on the first conductive layer; and patterning the first conductive layer and the second conductive layer to respectively form a first conductive layer pattern and a second conductive layer pattern, where the first conductive layer pattern is formed after the second conductive layer pattern is formed, and the first conductive layer pattern and the second conductive layer pattern are different from each other.

For example, in the method of manufacturing a touch structure provided by at least one embodiment of the present disclosure, after the second conductive layer is patterned to form the second conductive layer pattern, a photolithography process is performed on the first conductive layer to form the first conductive layer pattern.

For example, in the method of manufacturing a touch structure provided by at least one embodiment of the present disclosure, the photolithography process is performed on the first conductive layer to form the first conductive layer pattern by using the second conductive layer pattern as an alignment mark.

For example, in the method of manufacturing a touch structure provided by at least one embodiment of the present disclosure, after the first conductive layer is formed on the base substrate, a photoresist coating process, an exposing process, and a developing process are performed on the first conductive layer to form a first photoresist pattern, the second conductive layer is formed on the first conductive layer and the first photoresist pattern, the second conductive layer is patterned to form the second conductive layer pattern, and then the first conductive layer is etched using the first photoresist pattern to form the first conductive layer pattern.

For example, in the method of manufacturing a touch structure provided by at least one embodiment of the present disclosure, the second conductive layer is patterned to form the second conductive layer pattern by using the first photoresist pattern as an alignment mark.

For example, in the method of manufacturing a touch structure provided by at least one embodiment of the present disclosure, a same etchant is used to etch the second conductive layer to pattern the second conductive layer and etch the first conductive layer using the first photoresist pattern to form the first conductive layer pattern.

For example, in the method of manufacturing a touch structure provided by at least one embodiment of the present disclosure, the same etchant comprises a weak acid solution.

For example, in the method of manufacturing a touch structure provided by at least one embodiment of the present disclosure, the weak acid solution comprises an oxalic acid solution or a phosphoric acid solution.

For example, in the method of manufacturing a touch structure provided by at least one embodiment of the present disclosure, the first conductive layer is a first transparent conductive layer, and the second conductive layer is a metal layer, and the first conductive layer pattern is a first transparent conductive layer pattern, and the second conductive layer pattern is a metal layer pattern.

For example, in the method of manufacturing a touch structure provided by at least one embodiment of the present disclosure, the touch structure comprises a touch region and a periphery region, and the second conductive layer pattern is formed in the periphery region.

For example, in the method of manufacturing a touch structure provided by at least one embodiment of the present disclosure, the first conductive layer pattern is formed in both the touch region and the periphery region, and a portion of the first conductive layer pattern formed in the touch region comprises: a first sensing line pattern formed along a first direction, the first sensing line pattern comprising a plurality of first sensing electrodes that are spaced apart from each other; and a second sensing line pattern extending along a second direction, the second sensing line pattern passing through intervals of the plurality of first sensing electrodes, and in the periphery region, the second conductive layer pattern and a portion of the first conductive layer pattern in the periphery region are formed to be lead wires of the first sensing line pattern and the second sensing line pattern.

For example, the method of manufacturing a touch structure provided by at least one embodiment of the present disclosure further comprises: forming a first protective layer, and patterning the first protective layer to form a first protective layer pattern, where the first protective layer pattern exposes at least a portion of the plurality of first sensing electrodes.

For example, in the method of manufacturing a touch structure provided by at least one embodiment of the present disclosure, a via hole is formed in the first protective layer pattern to expose the portion of the plurality of first sensing electrodes.

For example, the method of manufacturing a touch structure provided by at least one embodiment of the present disclosure further comprises: forming a third conductive layer, and patterning the third conductive layer to form a third conductive layer pattern, where the third conductive layer pattern is formed on the first protective layer pattern, and electrically connects adjacent first sensing electrodes to each other through the portion exposed of the plurality of first sensing electrodes.

For example, the method of manufacturing a touch structure provided by at least one embodiment of the present disclosure further comprises: forming a second protective layer to cover at least the first conductive layer pattern and the third conductive layer pattern, and patterning the second protective layer to form a second protective layer pattern.

For example, in the method of manufacturing a touch structure provided by at least one embodiment of the present disclosure, the first protective layer further exposes the second conductive layer pattern, and the second protective layer pattern covers the second conductive layer pattern.

For example, in the method of manufacturing a touch structure provided by at least one embodiment of the present disclosure, a material of the base substrate comprises a polycycloolefin polymer material.

At least one embodiment of the present disclosure provides a touch structure manufactured by any one of the above methods.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIGS. 5A1-5C2 are sectional schematic diagrams and plane schematic diagrams of a touch structure in a manufacture process provided by an embodiment of the present disclosure;

DETAILED DESCRIPTION

Figure 1:
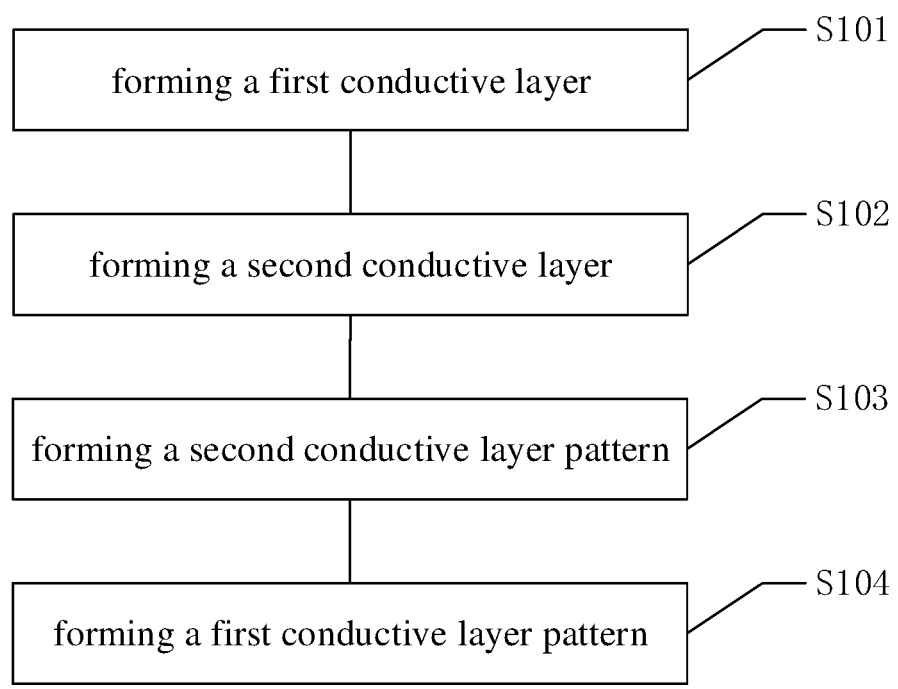
FIG. 1 is a flow diagram of a method of manufacturing a touch structure provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Manufacture processes of a touch structure generally adopt a method of forming functional layers one by one on a substrate and etching the functional layers to form functional patterns, such as forming a first functional layer on the substrate, and etching the first functional layer to form a first functional layer pattern, and then forming a second functional layer, and etching the second functional layer to form a second functional layer pattern . . . . In this process, after the first functional layer pattern is formed, maybe for reasons such as the first functional layer is relatively thin, an exposure machine cannot be accurately aligned with the first functional layer when the second functional layer is etched, so that a deviation between the first functional layer pattern and the second functional layer pattern is formed, resulting in that product functions and yield cannot be guaranteed. Generally, the first functional layer pattern and the second functional layer pattern that are different from each other are formed, for example, by two patterning processes or one single gray tone process.

At least one embodiment of the present disclosure provides a method of manufacturing a touch structure, the method comprises: forming a first conductive layer on a base substrate; forming a second conductive layer on the first conductive layer; and patterning the first conductive layer and the second conductive layer to respectively form a first conductive layer pattern and a second conductive layer pattern, where the first conductive layer pattern is formed after the second conductive layer pattern is formed, and the first conductive layer pattern and the second conductive layer pattern are different from each other.

The first conductive layer pattern and the second conductive layer pattern are formed, for example, in different regions, or formed to comprise at least partially different patterns (such as different wires, electrodes, contact pads, or the like), or the first conductive layer pattern and the second conductive layer pattern are formed to be laminated to each other, but are designed to have different widths and so on, and therefore the first conductive layer pattern and the second conductive layer pattern are different from each other.

At least one embodiment of the present disclosure provides a touch structure, which is manufactured by any one of the methods provided by embodiments of the present disclosure.

The method of manufacturing a touch structure and the touch structure provided by the present disclosure are described below by several specific embodiments.

The capacitive touch structure can operate by using the current sensing of a human body. In a case where a user touches the capacitive touch structure, because of an electric field of the human body, a coupling capacitor is formed by the user's finger and a working surface of the touch structure. Because high frequency signals are loaded on the working surface, the finger absorbs a small current, and a controller can analyze to obtain a touch position by sensing the current. The capacitive touch structure can be divided into two types comprising a surface type capacitive touch structure and a projected type capacitive touch structure. The projected type capacitive touch structure can be divided into two types comprising a self-capacitive touch structure and a mutual capacitive touch structure. In the following, the mutual capacitive touch structure which is more common is briefly introduced as an example.

The mutual capacitive touch structure generally comprises a plurality of lateral electrodes and a plurality of longitudinal electrodes formed on a substrate, and capacitors are formed at positions where the two sets of electrodes intersect, that is to say, the two sets of electrodes respectively constitute two electrodes of the capacitors. In a case that a finger touches the touch structure, the finger may affect a coupling state between the two electrodes near the touch point, so as to change the capacitance between the two electrodes. According to capacitance variation data of the touch structure and coordinates of each capacitor, coordinates of each touch point can be obtained. When the value of the capacitance is detected, the lateral electrodes sequentially emit excitation signals, and all the longitudinal electrodes receive signals at the same time or sequentially, so that capacitance values of all intersections of the lateral electrodes and the longitudinal electrodes can be obtained, that is, capacitance values of the two-dimensional plane of the whole touch structure can be obtained. Therefore, even if there are multiple touch points on the touch structure, actual coordinates of each touch point can be calculated.

Embodiments of the present disclosure provide a touch structure and a method of manufacturing a touch structure. FIG. 1 is a flow diagram of a method of manufacturing a touch structure provided by the embodiment; FIG. 3 is a plane schematic diagram of a first conductive layer pattern of a touch structure provided by the embodiment; and FIG. 5C2 is a plane schematic diagram of the touch structure. The touch structure is formed on a substrate. As illustrated in FIG. 1, the method comprises following steps S101-S104.

S101: forming a first conductive layer.

Figure 2A:
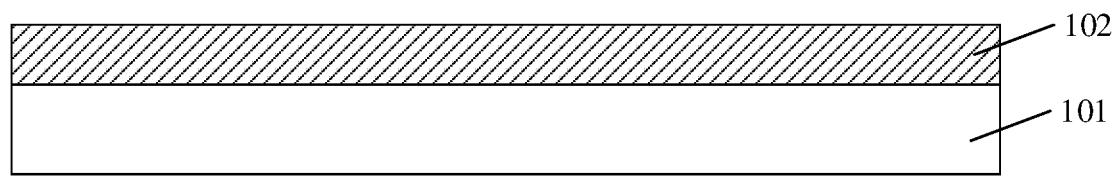
FIGS. 2A-2D are sectional schematic diagrams of a touch structure in a manufacture process provided by an embodiment of the present disclosure.
Figure 3:
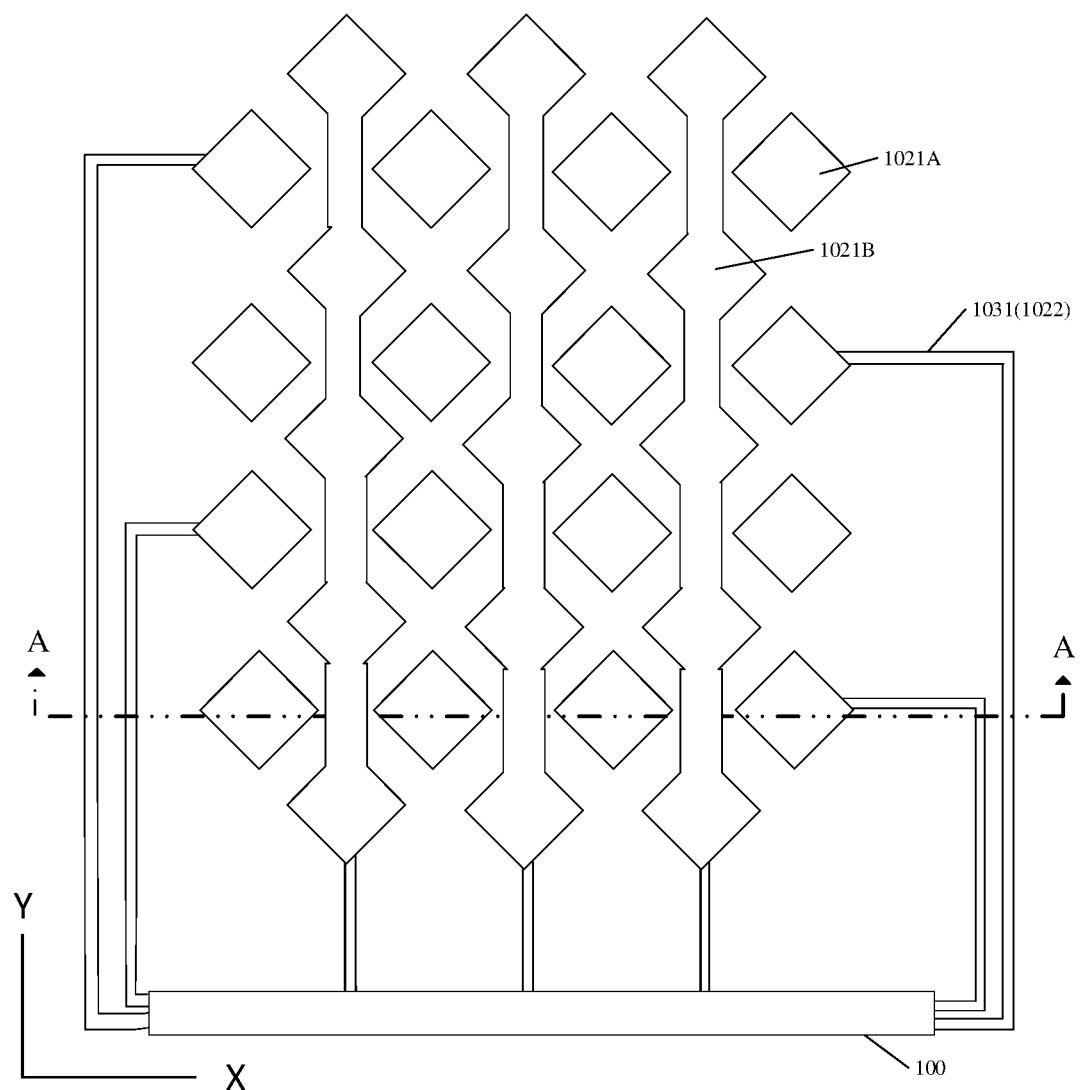
FIG. 3 is a plane schematic diagram of a first conductive layer pattern of a touch structure provided by an embodiment of the present disclosure.

In the embodiment, as illustrated in FIG. 2A, a first conductive layer 102 is first formed on a base substrate 101. In the embodiment, a material of the base substrate 101 may comprise, for example, a polymer material, such as a polycycloolefin polymer material (COP), or the material of the base substrate 101 may comprise glass, quartz, ceramics, or the like, which is not limited in the embodiment. A material of the first conductive layer 102 may comprise, for example, a transparent conductive material, such as indium tin oxide (ITO), indium zinc oxide (IZO), or the like. The first conductive layer 102 may be formed on a surface of the base substrate 101 by, for example, a sputtering method or a deposition method. For example, in a case where the material of the first conductive layer 102 is indium tin oxide (ITO), the first conductive layer 102 may be formed on the base substrate 101 by a magnetron sputtering method, a chemical vapor deposition method or the like.

In another example of the embodiment, the base substrate 101 may also directly adopt a material that has been coated with the first conductive layer 102, for example, adopt a commercially available polycycloolefin polymer material (COP) having a surface coated with ITO.

S102: forming a second conductive layer.

Figure 2B:
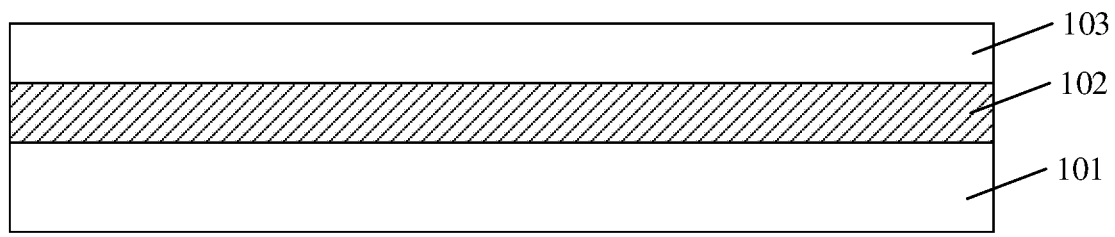

In the embodiment, as illustrated in FIG. 2B, after the first conductive layer 102 is formed, the second conductive layer 103 is directly formed on the first conductive layer 102. In the embodiment, the second conductive layer 103 may be, for example, a metal layer, and a material of the metal layer may comprise, for example, copper or copper alloy, aluminum or aluminum alloy, or the like. The second conductive layer 103 may be formed on a surface of the first conductive layer 102 by, for example, a sputtering method or the like.

S103: forming a second conductive layer pattern.

Figure 2C:
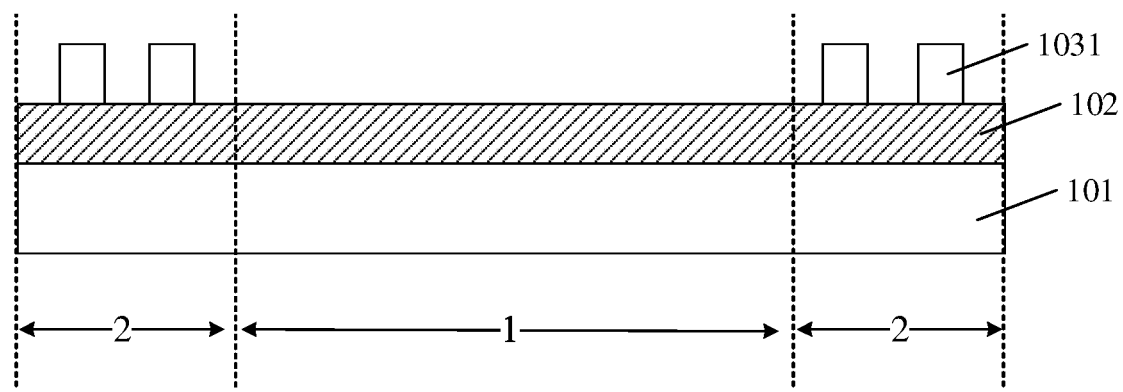

In the embodiment, as illustrated in FIG. 2C, after the second conductive layer 103 is formed, the second conductive layer 103 is patterned to form a second conductive layer pattern 1031. In the embodiment, when the second conductive layer 103 is patterned by a photolithography process, an etchant only having an etching effect on the second conductive layer 103 but having no etching effect on the first conductive layer 102 may be used. For example, in a case where the second conductive layer 103 is the metal layer and the first conductive layer 102 is an indium tin oxide layer (ITO layer), an etchant, such as hydrogen peroxide or the like, which has an etching effect on the metal layer but has no etching effect on the ITO, may be used to etch the second conductive layer 103, so as to form the second conductive layer pattern 1031. Because the etchant does not have the etching effect on the first conductive layer 102, the integrity of the first conductive layer 102 can be maintained. In the embodiment, the touch structure may comprise a touch region 1 and a periphery region 2, and the second conductive layer pattern 1031 is formed in the periphery region 2. In the embodiment, for example, the second conductive layer 103 may be patterned by a photolithography process, and the photolithography process comprises steps of photoresist coating, exposing, developing, etching, and so on.

S104: forming a first conductive layer pattern.

Figure 2D:
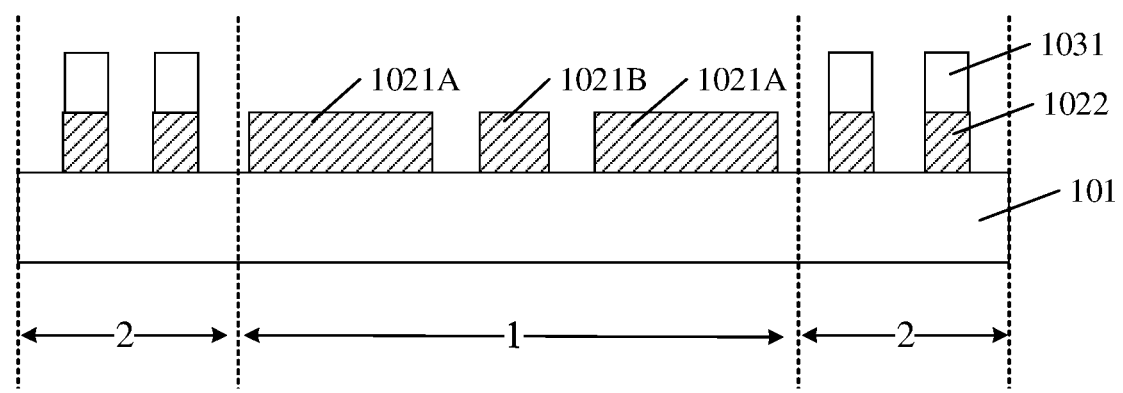

In the embodiment, as illustrated in FIG. 2D, after the second conductive layer pattern 1031 is formed, the first conductive layer 102 is patterned to form a first conductive layer pattern. In the embodiment, for example, the first conductive layer 102 may be patterned by a photolithography process. The photolithography process comprises steps of photoresist coating, exposing, developing, etching, and so on. In the embodiment, in a case where the material of the first conductive layer 102 is indium tin oxide (ITO), for example, the first conductive layer 102 may be etched by aqua regia as an etchant to form the first conductive layer pattern. The second conductive layer pattern 1031 which has been formed may be covered by the photoresist pattern to be protected, so that the second conductive layer pattern 1031 is not adversely affected by the etchant during a process of etching the first conductive layer 102.

In the embodiment, in order to align the first conductive layer pattern with the second conductive layer pattern 1031 during the photolithography process, the second conductive layer pattern 1031 or a portion (for example, a specially manufactured pattern for alignment) may be used as an alignment mark to etch the first conductive layer 103, so as to form the first conductive layer pattern. For example, in the exposing step of the photolithography process, the position of the second conductive layer pattern 1031 may be scanned by a photographing system of an exposure machine, and the alignment operation may be performed; alternatively, after the second conductive layer pattern 1031 is formed, an alignment mark is formed based on the second conductive layer pattern 1031, and the alignment mark is used for the alignment operation of the exposure machine, so that the formed first conductive layer pattern is aligned with the second conductive layer pattern 1031.

In the embodiment, the first conductive layer pattern may be formed, for example, in both the touch region 1 and the periphery region 2, and comprise a touch pattern in the touch region 1 and a periphery pattern 1022 in the periphery region 2.

For example, FIG. 3 is a plane schematic diagram of the first conductive layer pattern in the embodiment, and FIG. 2D is a sectional schematic diagram taken along line A-A of FIG. 3. As illustrated in FIG. 3, the touch pattern of the first conductive layer pattern in the touch region 1 comprises, for example, a first sensing line pattern 1021A formed along a first direction, such as an X direction in the figure, and the first sensing line pattern 1021A comprises a plurality of first sensing electrodes that are spaced apart from each other. The touch pattern further comprises a second sensing line pattern 1021B extending along a second direction, such as a Y direction in the figure, the second sensing line pattern 1021B passes through intervals of the plurality of first sensing electrodes 1021A. In the embodiment, for example, the first direction and the second direction are substantially perpendicular to each other.

It should be noted that, for the sake of clear illustration, the touch region 1 in FIG. 2D only shows two first sensing electrodes comprised in the first sensing line pattern 1021A and one second sensing line pattern 1021B extending in the Y direction disposed at an interval between the two first sensing electrodes. In actual situations, the number of the first sensing electrodes comprised in the first sensing line pattern 1021A and the number of the second sensing line patterns 1021B may be more, and the embodiment is not limited in this aspect.

In the embodiment, as illustrated in FIG. 3, the second conductive layer pattern 1031 and the periphery pattern 1022 of the first conductive layer pattern in the periphery region 2 may be, for example, lead wires of the first sensing line pattern 1021A and the second sensing line pattern 1021B, so as to connect the first sensing line pattern 1021A and the second sensing line pattern 1021B with a control unit 100 that performs functions such as calculating the touch position and so on. In the embodiment, a position at which the periphery pattern 1022 of the first conductive layer pattern in the periphery region 2 is formed corresponds to a position at which the second conductive layer pattern 1031 is formed. Therefore, after the second conductive layer pattern 1031 is formed, when the periphery pattern 1022 of the first conductive layer pattern is etched, the second conductive layer pattern 1031 is coated with the photoresist, thereby preventing the etchant for etching the first conductive layer from corroding the second conductive layer pattern 1031.

Figure 4:
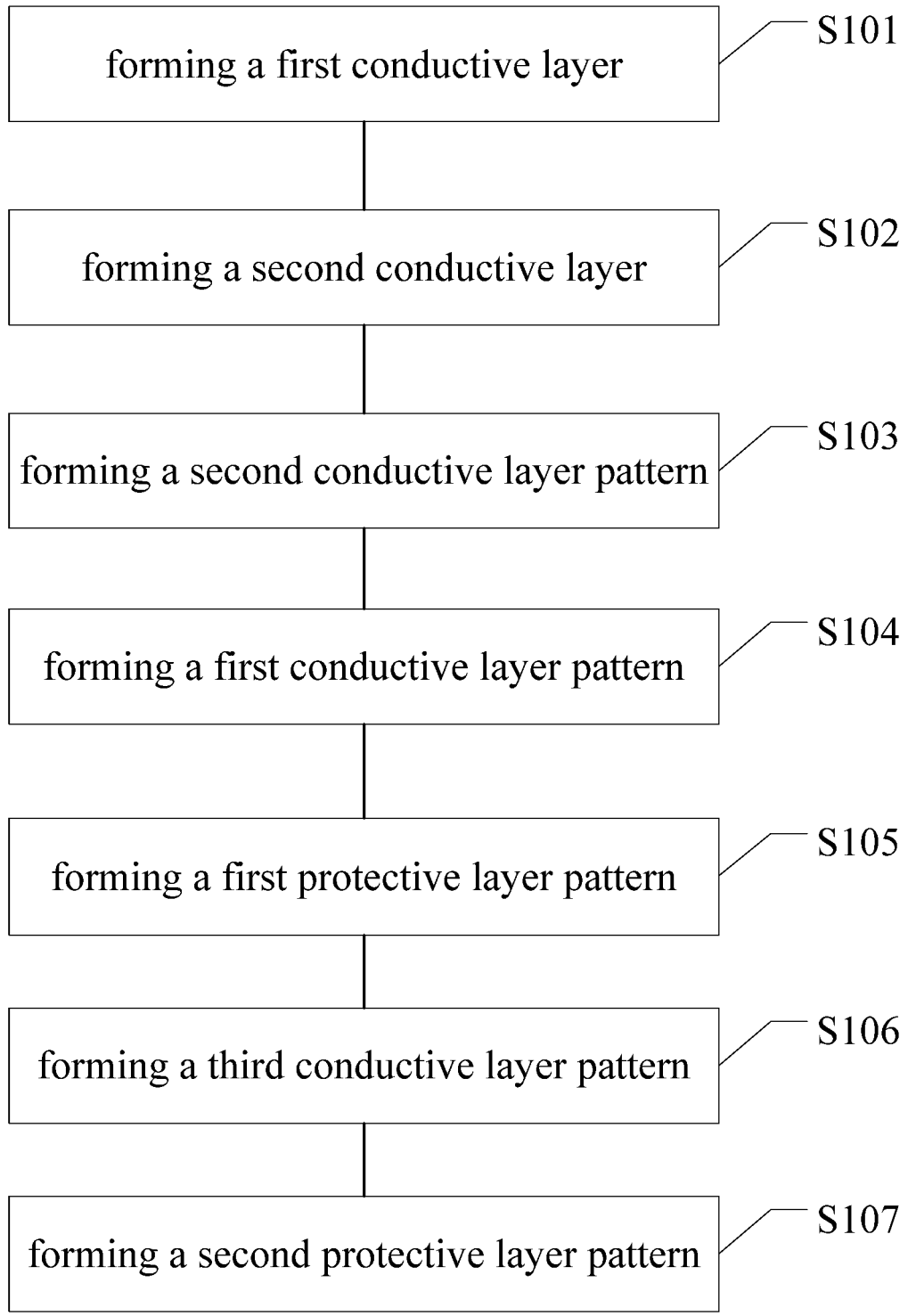
FIG. 4 is a flow diagram of another method of manufacturing a touch structure provided by an embodiment of the present disclosure.

The method for manufacturing the touch structure provided by the embodiment is illustrated in FIG. 4, and the method may further comprise steps S105-S107.

S105: forming a first protective layer pattern.

FIG. 5A1 and FIG. 5A2 are respectively a sectional schematic diagram and a plane schematic diagram of the touch structure formed in this step (the sectional schematic diagram is obtained by taken along the line A-A as a hatching line in the plane schematic diagram. For clear illustration, the touch region 1 in the sectional schematic diagram of FIG. 5A1 only shows two first sensing electrodes comprised in the first sensing line pattern 1021A and one second sensing line pattern 1021B extending in the Y direction disposed at the interval between the two first sensing electrodes). In the embodiment, as illustrated in FIG. 5A1 and FIG. 5A2, after the first conductive layer pattern is formed, for example, a first protective layer 104 may be formed on the first conductive layer pattern, and the first protective layer 104 is patterned to form a first protective layer pattern, and the first protective layer pattern exposes at least a portion of the plurality of first sensing electrodes. For example, as illustrated in FIG. 5A1 and FIG. 5A2, the portion of the plurality of first sensing electrodes may be exposed by a method of forming a via hole 1041 in the first protective layer pattern. In the embodiment, the first protective layer pattern may cover or expose the second conductive layer pattern 1031.

In the embodiment, the first protective layer 104 may be, for example, an organic insulating layer, and a material of the organic insulating layer may comprise, for example, a polymer material such as resin or the like, and the organic insulating layer is formed on the first conductive layer pattern by a coating method or the like. The material and specific forming method of the first protective layer 104 are not limited by the embodiment. In the embodiment, for example, the first protective layer 104 may be patterned by a photolithography process to form the first protective layer pattern, and the photolithography process comprises steps of photoresist coating, exposing, developing, etching, and so on.

S106: forming a third conductive layer pattern.

In the embodiment, as illustrated in FIG. 5B1 and FIG. 5B2, after the first protective layer pattern is formed, for example, a third conductive layer 105 may further be formed, and the third conductive layer 105 is patterned to form a third conductive layer pattern. In the embodiment, for example, the third conductive layer 105 may also be patterned by a photolithography process to form the third conductive layer pattern. The third conductive layer pattern may be formed, for example, on the first protective layer pattern which covers the first sensing line pattern 1021A, and formed on the portion exposed of the first sensing electrodes through the via hole 1041, so as to electrically connects the adjacent first sensing electrodes to each other.

S107: forming a second protective layer pattern.

In the embodiment, as illustrated in FIG. 5C1 and FIG. 5C2, after the third conductive layer pattern is formed, for example, a second protective layer 106 may further be formed, and the second protective layer 106 is patterned to form a second protective layer pattern. In the embodiment, for example, the second protective layer 106 may also be patterned by a photolithography process to form the second protective layer pattern. The second protective layer pattern may cover, for example, the first conductive layer pattern and the third conductive layer pattern, for example, may further cover the second conductive layer pattern 1031, so as to protect each conductive layer and prevent the patterns from being oxidized.

In the method for manufacturing a touch structure provided by the embodiment, the second conductive layer is formed after the first conductive layer is formed, and the second conductive layer is first patterned, and then the first conductive layer is patterned, therefore, the more accurate alignment of the first conductive layer pattern and the second conductive layer pattern are achieved, and problems such as difficulty in aligning the second conductive layer pattern with the first conductive layer pattern due to a reason that the first conductive layer is relatively thin and the like are avoided.

At least one embodiment of the present disclosure further provides another method of manufacturing a touch structure, the method also includes the steps S101-S104 in the above embodiment, in the embodiment, what is different from the above embodiment is the specific forming processes adopted in steps S101-S104. The method for manufacturing a touch structure provided by the embodiment is as follows.

S101: forming a first conductive layer.

Figure 6A:
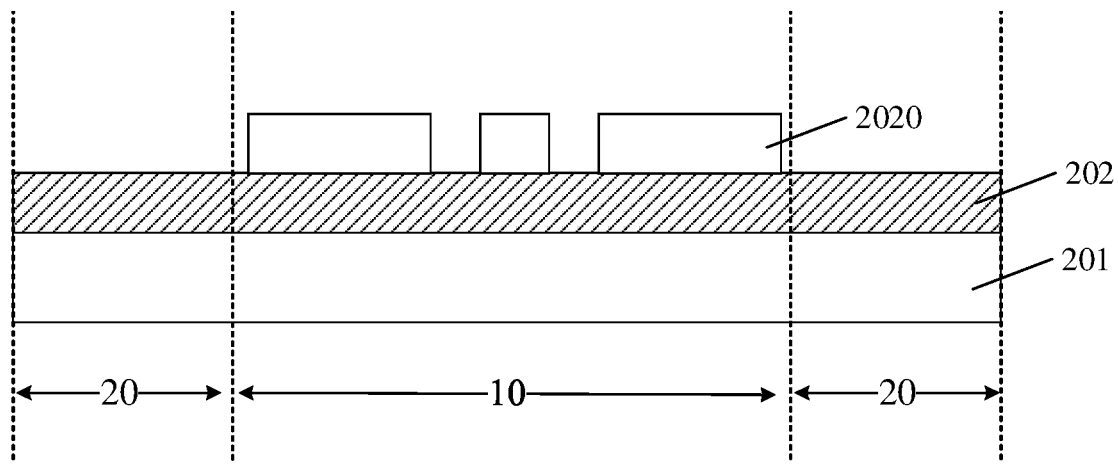
FIGS. 6A-6D are sectional schematic diagrams of another touch structure in a manufacture process provided by an embodiment of the present disclosure.

In the embodiment, as illustrated in FIG. 6A, a first conductive layer 202 is formed on a base substrate 201. The forming method and the used material of the first conductive layer 202 are the same as those in the above embodiment. The difference between this embodiment and the above embodiment is that in this embodiment, after the first conductive layer 202 is formed, a photoresist coating, exposing, and developing processes are performed on the first conductive layer 202 to form a first photoresist pattern 2020. In this embodiment, the first photoresist pattern 2020 may be formed, for example, in the touch region 10. After the first photoresist pattern 2020 is formed, the first conductive layer 202 is not etched, and a subsequent forming process is performed.

S102: forming a second conductive layer.

Figure 6B:
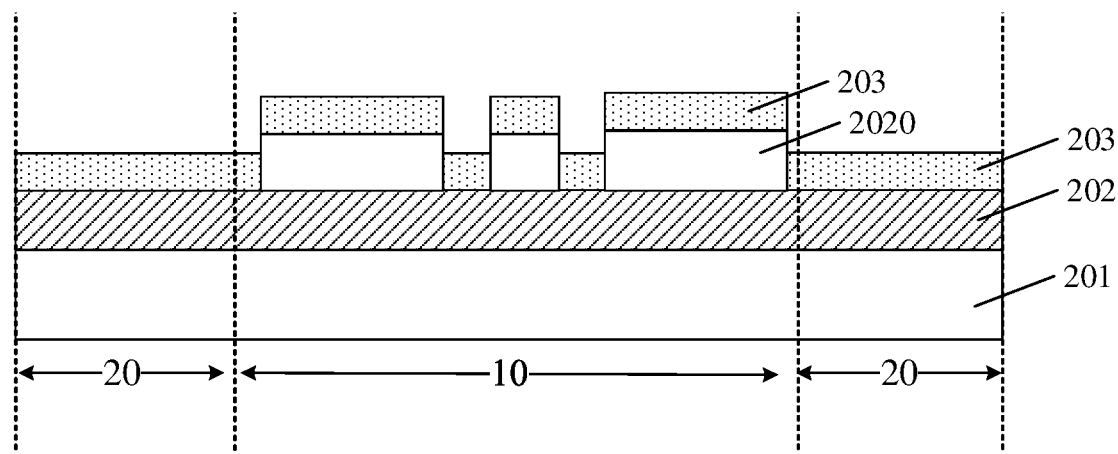

In the embodiment, as illustrated in FIG. 6B, after the first photoresist pattern 2020 is formed, a second conductive layer 203 is formed on the first conductive layer 202 and the first photoresist pattern 2020. In the embodiment, the forming method and the used material of the second conductive layer 203 are the same as those in the above embodiment, and are not described here again.

S103: forming a second conductive layer pattern.

In the embodiment, the second conductive layer 203 is patterned to form a second conductive layer pattern. The method of patterning the second conductive layer 203 in this embodiment is different from that in the above embodiment. In this embodiment, when the photolithography process is performed for patterning, in order to align the first conductive layer pattern with the second conductive layer pattern, the photolithography process may be performed on the second conductive layer 203 to form the second conductive layer pattern by using the first photoresist pattern 2020 formed in the step S101 or a portion (for example, a specially manufactured pattern for alignment) as an alignment mark. For example, in the exposing step of the photolithography process, the position of the first photoresist pattern 2020 may be scanned by a photographing system of an exposure machine, and the alignment operation may be performed; alternatively, because there is a protruding alignment mark (not shown in the figure) in the first conductive layer 202, in a case where the photoresist is coated, a thickness protruding portion corresponding to the alignment mark exists in the photoresist, so that the thickness protruding portion can be used for the alignment operation of the exposure machine, and then a subsequent process is performed. Finally, the alignment of the first conductive layer pattern with the second conductive layer pattern is achieved.

Figure 6C:
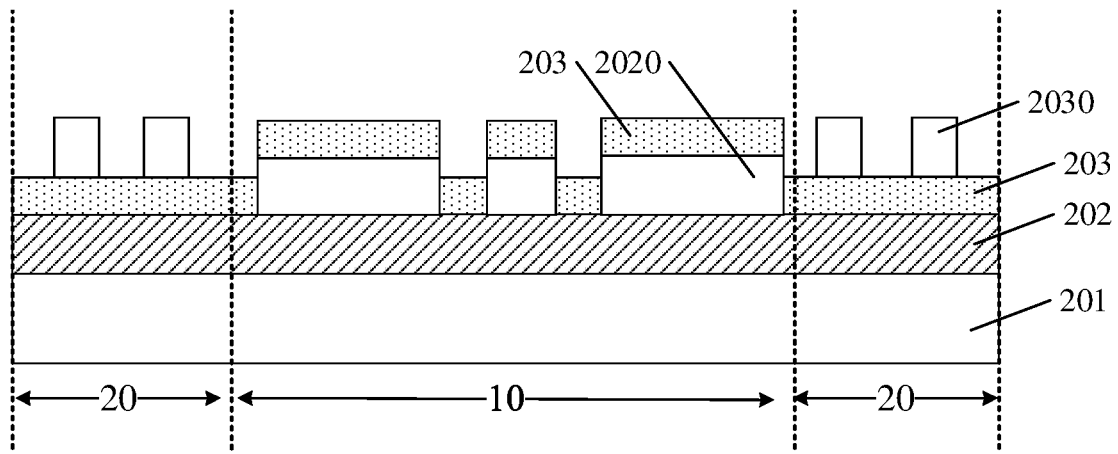
Figure 6D:
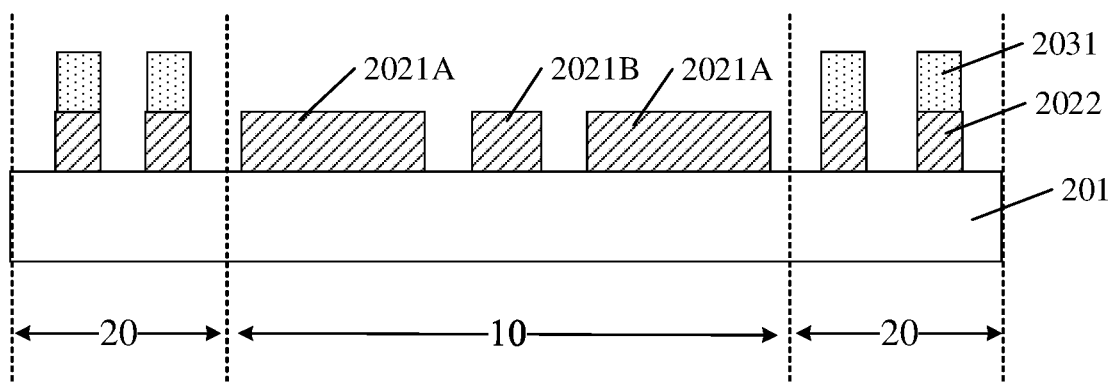

In the embodiment, as illustrated in FIG. 6C and FIG. 6D, the photolithography process is performed based on the above alignment operation, and steps of photoresist coating, exposing, and developing are performed on the second conductive layer 203 to form a second photoresist pattern 2030, the second photoresist pattern 2030 may be formed, for example, in the periphery region 20. After the second photoresist pattern 2030 is formed, a same etchant is used to etch the second conductive layer 203 to form a second conductive layer pattern 2031 in the periphery region 20 and etch the first conductive layer 202 using the first photoresist pattern 2020 to form a first conductive layer pattern. The first conductive layer pattern comprises a first sensing line pattern 2021A and a second sensing line pattern 2021B that are in the touch region 10, and a periphery pattern 2022 in the periphery region 20. In this situation, the etchant should have etching effects on both the material used for the first conductive layer 202 and the material used for the second conductive layer 203. For example, in the embodiment, in a case where the first conductive layer 202 is an ITO transparent conductive layer and the second conductive layer 203 is a metal layer, the etchant may comprise, for example, a weak acid solution. For example, an oxalic acid solution, a phosphoric acid solution or the like may be used for etching. Therefore, the two functional layers of the ITO transparent conductive layer and the metal layer are simultaneously etched by the same etchant.

S104: forming a first conductive layer pattern.

In the embodiment, as illustrated in FIG. 6D, because the second conductive layer 203 and the first conductive layer 202 are etched by the same etchant, after the second conductive layer pattern 2031 that is in an upper layer is formed, or where the etchant etches the second conductive layer 203 and contacts the first conductive layer 202, the first conductive layer 202 is further etched to form the first conductive layer pattern, and therefore the second conductive layer pattern 2031 and the first conductive layer pattern may be formed sequentially in a relatively fast time or almost simultaneously.

In the embodiment, the method of manufacturing the touch structure may also comprise the steps S105-S107 in the above embodiment, that is, the steps of forming the first protective layer pattern, the third conductive layer pattern, and the second protective layer pattern. The specific operation methods of these steps are the same as those in the above embodiment, and details are not described here again.

With the manufacturing method of this embodiment or the manufacturing method of the above embodiment, substantially the same touch structure can be formed, and each conductive layer pattern of the touch structure is aligned more accurately, so that the touch sensing is sensitive and the function is stronger.

At least one embodiment of the present disclosure further provides a touch structure, and the touch structure is manufactured by any one of the methods of manufacturing a touch structure provided by embodiments of the present disclosure. The touch structure may be, for example, a capacitive touch screen, for example, may be a surface type capacitive touch screen or a projected type capacitive touch screen, for example, may also be a self-capacitive touch screen or a mutual capacitive touch screen. The specific type of the touch structure is not limited in the embodiment. In the touch structure provided by the embodiment, the alignment of each conductive layer pattern is more accurate, so that the touch sensing is sensitive and the function is stronger.

Figure 7:
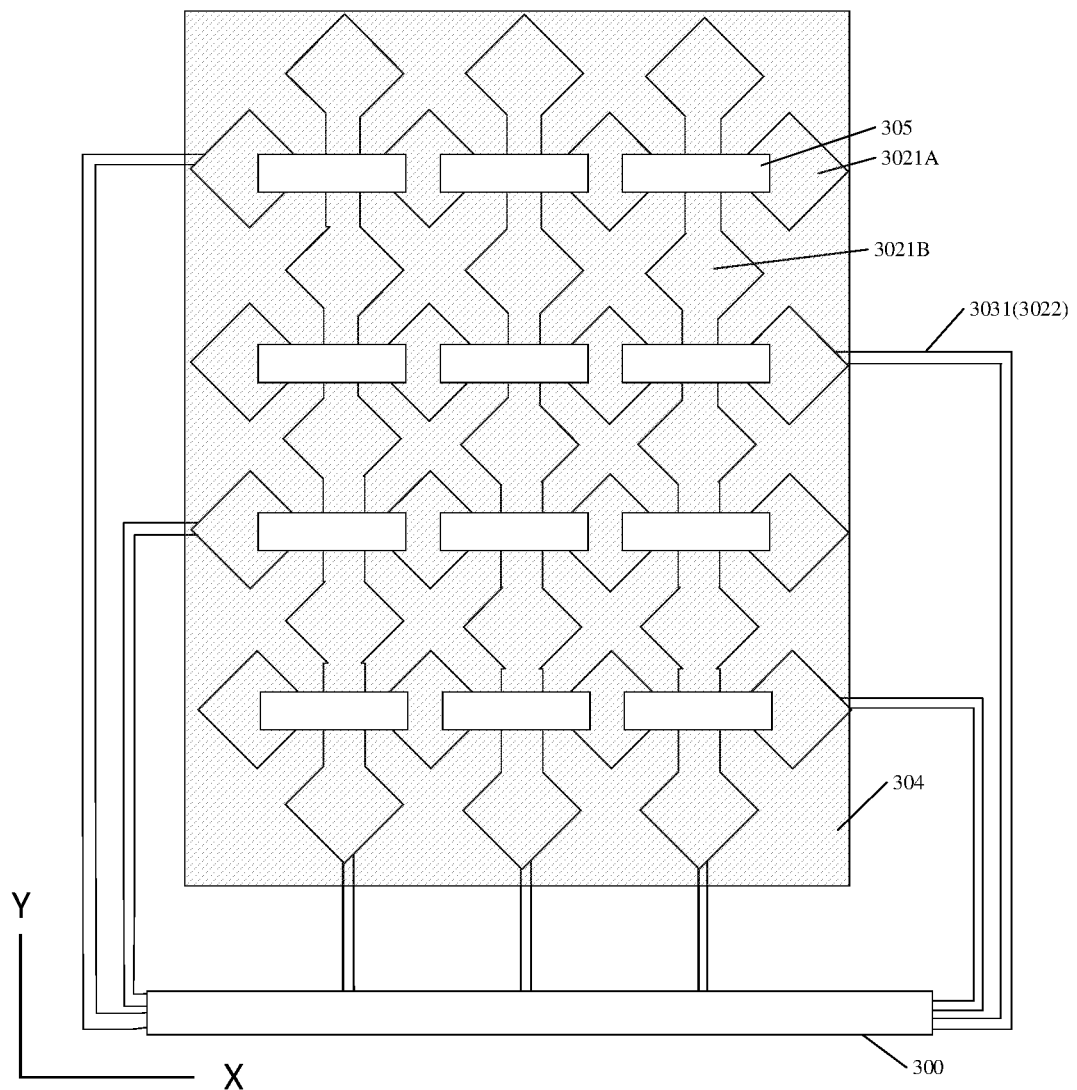
FIG. 7 is a plane schematic diagram of a touch structure provided by an embodiment of the present disclosure.

For example, as illustrated in FIG. 7, the embodiment provides a mutual capacitive touch screen, the touch screen comprises a first sensing line pattern 3021A along the X direction and a second sensing line pattern 3021B along the Y direction that are formed on a base substrate (not shown). The first sensing line pattern 3021A comprises a plurality of first sensing electrodes that are spaced apart from each other, the second sensing line pattern 3021B is continuous and passes through intervals of the first sensing electrodes 3021A. The touch screen further comprises a first protective layer pattern 304 and a third conductive layer pattern 305, the first protective layer pattern 304 is formed at least on a portion, which corresponds to an interval of the first sensing electrodes 3021A, of the second sensing line pattern 3021B. For example, in the embodiment, the first protective layer pattern 304 is formed on surfaces of the first sensing line pattern 3021A and the second sensing line pattern 3021B and exposes a portion (not shown) of the first sensing electrodes 3021A, and the third conductive layer pattern 305 is formed on the first protective layer pattern 304 and bridges the adjacent two first sensing electrodes having the interval through the exposed portion, and therefore the first sensing line pattern 3021A and the second sensing line pattern 3021B have intersecting portions and the first sensing line pattern 3021A and the second sensing line pattern 3021B are insulated by the first protective layer pattern 304 at the intersecting portions, so that capacitors are formed at the intersecting portions, and the first sensing line pattern 3021A and the second sensing line pattern 3021B respectively constitute two electrodes of the capacitors.

The touch screen further comprises a metal line 3031 as a lead wire and a periphery pattern 3022 that is in the same layer as the first sensing line pattern 3021A and the second sensing line pattern 3021B, and the metal line 3031 and the periphery pattern 3022 connect the first sensing line pattern 3021A and the second sensing line pattern 3021B to a control unit 300 having functions such as calculating a touch point or the like. Therefore, in a case where a finger touches the touch screen, the finger affects the coupling between the two electrodes near the touch point, and therefore changes the capacitance between the two electrodes. The control unit 300 may receive the capacitance variation data, and calculate coordinates of each touch point according to the capacitance variation data. When the value of the capacitance is detected, the first sensing line pattern 3021A which serves as an electrode that emits excitation signals sequentially emits excitation signals, and the second sensing line pattern 3021B which serves as an electrode that receives signals receives signals while the first sensing line pattern 3021A emits excitation signals. Therefore, the control unit 300 can obtain the capacitance values of the intersections of all the first sensing line pattern 3021A and the second sensing line pattern 3021B, that is, the capacitance values of the two-dimensional plane of the whole touch screen, furthermore the control unit 300 can calculate the coordinates of each touch point on the touch screen, so that the touch operation is achieved.

It should be noted that the mutual capacitive touch screen provided by the embodiment may further comprise structures such as other protective layers for protecting respective functional layers and so on, and details are not described in the embodiment.

At least one embodiment of the present disclosure further provides an electronic device, and the electronic device comprises any one of the touch structures provided by the above embodiments of the present disclosure. For example, the electronic device may be a display device. For example, the display device comprises an array substrate and an opposite substrate (for example, a color filter substrate) that is assembled with the array substrate. For example, the touch structure may be disposed on a protective cover plate, the protective cover plate is used to cover a display screen to protect the display screen, and a side, which is formed with the touch structure, of the protective cover plate faces the display screen. That is, a combination mode of the touch structure and the display screen is an OGS (One Glass Solution) mode. For another example, the touch structure may be disposed on a side of the opposite substrate that is far away from the array substrate, and a polarizer may be further disposed on a side of the touch structure that is far away from the opposite substrate. That is, a combination mode of the touch structure and the display screen is an On-Cell (external arrangement type) mode. The embodiment of the present disclosure does not limit the combination mode of the touch structure in the electronic device.

The method of manufacturing a touch structure and the touch structure provided by at least one embodiment of the present disclosure have at least one of the following beneficial effects:

(1) In the method of manufacturing a touch structure provided by the embodiments of the present disclosure, the second conductive layer is formed after the first conductive layer is formed, and the second conductive layer is patterned first and then the first conductive layer is patterned. Therefore, the more accurate alignment of the second conductive layer pattern with the first conductive layer pattern is achieved.

(2) The method of manufacturing a touch structure provided by the embodiments of the present disclosure provides many kinds of processes for aligning the second conductive layer pattern with the first conductive layer pattern, and different processes may be selected in actual production according to specific conditions. Therefore, the more accurate alignment of the second conductive layer pattern with the first conductive layer pattern is achieved, and the production yield of the product is improved.

(3) The embodiments of the present disclosure provide a touch structure, which is obtained by the manufacturing method provided by the embodiments of the present disclosure. Each conductive layer pattern of the touch structure is aligned more accurately, so that the touch sensing is sensitive, and the function is stronger.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or a structure may be enlarged or narrowed, that is, the drawings are not drawn in a real scale. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, the embodiments of the present disclosure and the features in the embodiment(s) can be combined to obtain new embodiments.

The above descriptions are only specific embodiments of the present disclosure, but the protection scope of the present disclosure is not limited thereto, those skilled who are familiar with the technical filed in the art may make some improvements and modifications within the technical scope of the present disclosure, and the improvements and modifications should be within the protection scope of the disclosure. Thus, the protection scope of the present disclosure should be determined by the protection scope of the claims.

What is claimed is:

1. A method of manufacturing a touch structure, comprising:

forming a first conductive layer on a base substrate;

forming a second conductive layer on the first conductive layer;

patterning the first conductive layer and the second conductive layer to respectively form a first conductive layer pattern and a second conductive layer pattern, wherein the first conductive layer pattern is formed after the second conductive layer pattern is formed, and the first conductive layer pattern and the second conductive layer pattern are different from each other, wherein the touch structure comprises a touch region and a periphery region, the first conductive layer pattern is formed in both the touch region and the periphery region, and a portion of the first conductive layer pattern formed in the touch region comprises a first sensing line pattern formed along a first direction, wherein the first sensing line pattern comprises a plurality of first sensing electrodes that are spaced apart from each other;

forming a first protective layer, and patterning the first protective layer to form a first protective layer pattern, wherein the first protective layer pattern exposes at least a portion of the plurality of first sensing electrodes, wherein a via hole is formed in the first protective layer pattern to expose the portion of the plurality of first sensing electrodes; and forming a third conductive layer, and patterning the third conductive layer to form a third conductive layer pattern, wherein the third conductive layer pattern is formed on the first protective layer pattern, and electrically connects adjacent first sensing electrodes to each other through the portion exposed of the plurality of first sensing electrodes.

2. The method of manufacturing the touch structure according to claim 1, wherein after the second conductive layer is patterned to form the second conductive layer pattern, a photolithography process is performed on the first conductive layer to form the first conductive layer pattern.

3. The method of manufacturing the touch structure according to claim 2, wherein the photolithography process is performed on the first conductive layer to form the first conductive layer pattern by using the second conductive layer pattern as an alignment mark.

4. The method of manufacturing the touch structure according to claim 1, wherein after the first conductive layer is formed on the base substrate, a photoresist coating process, an exposing process, and a developing process are performed on the first conductive layer to form a first photoresist pattern, the second conductive layer is formed on the first conductive layer and the first photoresist pattern, and the second conductive layer is patterned to form the second conductive layer pattern, and then the first conductive layer is etched using the first photoresist pattern to form the first conductive layer pattern.

5. The method of manufacturing the touch structure according to claim 4, wherein the second conductive layer is patterned to form the second conductive layer pattern by using the first photoresist pattern as an alignment mark.

6. The method of manufacturing the touch structure according to claim 4, wherein a same etchant is used to etch the second conductive layer to pattern the second conductive layer and etch the first conductive layer using the first photoresist pattern to form the first conductive layer pattern.

7. The method of manufacturing the touch structure according to claim 6, wherein the same etchant comprises a weak acid solution.

8. The method of manufacturing the touch structure according to claim 7, wherein the weak acid solution comprises an oxalic acid solution or a phosphoric acid solution.

9. The method of manufacturing the touch structure according to claim 1, wherein the first conductive layer is a first transparent conductive layer, and the second conductive layer is a metal layer, and the first conductive layer pattern is a first transparent conductive layer pattern, and the second conductive layer pattern is a metal layer pattern.

10. The method of manufacturing the touch structure according to claim 1, wherein the second conductive layer pattern is formed in the periphery region.

11. The method of manufacturing the touch structure according to claim 10, wherein the portion of the first conductive layer pattern formed in the touch region further comprises:

a second sensing line pattern extending along a second direction, wherein the second sensing line pattern passes through intervals of the plurality of first sensing electrodes, and wherein in the periphery region, the second conductive layer pattern and a portion of the first conductive layer pattern in the periphery region are formed to be lead wires of the first sensing line pattern and the second sensing line pattern.

12. The method of manufacturing the touch structure according to claim 1, further comprising:

forming a second protective layer to cover at least the first conductive layer pattern and the third conductive layer pattern, and patterning the second protective layer to form a second protective layer pattern.

13. The method of manufacturing the touch structure according to claim 12, wherein the first protective layer further exposes the second conductive layer pattern, and the second protective layer pattern covers the second conductive layer pattern.

14. The method of manufacturing the touch structure according to claim 1, wherein a material of the base substrate comprises a polycycloolefin polymer material.

15. A touch structure manufactured by the method according to claim 1.

16. The method of manufacturing the touch structure according to claim 2, wherein the first conductive layer is a first transparent conductive layer, and the second conductive layer is a metal layer, and the first conductive layer pattern is a first transparent conductive layer pattern, and the second conductive layer pattern is a metal layer pattern.

17. The method of manufacturing the touch structure according to claim 2, the second conductive layer pattern is formed in the periphery region.

* * * * *